United States Patent
Osterfeld et al.

(10) Patent No.: US 7,419,639 B2
(45) Date of Patent: Sep. 2, 2008

(54) MULTILAYER MICROFLUIDIC DEVICE

(75) Inventors: Sebastian J Osterfeld, Stanford, CA (US); Shan X. Wang, Portola Valley, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 8 days.

(21) Appl. No.: 11/388,223

(22) Filed: Mar. 22, 2006

(65) Prior Publication Data

US 2006/0210445 A1     Sep. 21, 2006

Related U.S. Application Data

(63) Continuation-in-part of application No. 11/297,883, filed on Dec. 9, 2005, now abandoned, and a continuation-in-part of application No. 11/128,105, filed on May 11, 2005.

(60) Provisional application No. 60/635,126, filed on Dec. 10, 2004, provisional application No. 60/570,672, filed on May 12, 2004.

(51) Int. Cl.
*B01L 3/02* (2006.01)
*G01N 15/06* (2006.01)
*G01N 33/00* (2006.01)
*G01N 33/48* (2006.01)

(52) U.S. Cl. .................. 422/100; 422/50; 422/68.1; 436/43; 436/63; 436/174; 436/180

(58) Field of Classification Search .................. 422/50, 422/68.1, 100; 436/43, 174, 63, 180
See application file for complete search history.

(56) References Cited

U.S. PATENT DOCUMENTS

| | | | | |
|---|---|---|---|---|
| 5,376,252 | A | 12/1994 | Ekström et al. | 204/299 |
| 5,571,410 | A * | 11/1996 | Swedberg et al. | 210/198.2 |
| 6,167,910 | B1 * | 1/2001 | Chow | 137/827 |
| 6,176,962 | B1 * | 1/2001 | Soane et al. | 156/292 |
| 6,210,986 | B1 * | 4/2001 | Arnold et al. | 438/42 |
| 6,284,072 | B1 * | 9/2001 | Ryan et al. | 156/59 |
| 6,408,878 | B2 * | 6/2002 | Unger et al. | 137/597 |
| 6,645,432 | B1 | 11/2003 | Anderson et al. | 422/100 |
| 6,752,966 | B1 * | 6/2004 | Chazan | 422/102 |
| 6,756,019 | B1 | 6/2004 | Dubrow et al. | 422/102 |
| 6,814,938 | B2 | 11/2004 | Karp et al. | 422/100 |
| 6,857,449 | B1 | 2/2005 | Chow | 137/833 |
| 6,890,093 | B2 | 5/2005 | Karp et al. | 366/336 |
| 6,929,030 | B2 * | 8/2005 | Unger et al. | 137/883 |

(Continued)

*Primary Examiner*—Brian J Sines
(74) *Attorney, Agent, or Firm*—Lumen Patent Firm, Inc.

(57) ABSTRACT

The present invention provides microfluidic devices constructed from four layers. The layers include a rigid substrate layer, a patterned rigid layer having thickness t, a patterned elastomeric layer having thickness greater than t, and a rigid support layer. Microfluidic structures in the devices are defined by the alignment of openings in the patterned rigid layer and the patterned elastomeric layer. The rigid support layer, rigid substrate layer, and patterned rigid layer may be made of any rigid material, including but not limited to plastic or silicon-containing materials, such as glass, quartz, or $SiO_2$-coated materials. Similarly, the patterned elastomeric layer may be made of any elastomeric material, including but not limited to polydimethylsiloxanes, polymethylmethacrylates, perfluoropolyethers, or combinations thereof. Microfluidic devices according to the present invention may include sensors or sensor arrays. The microfluidic devices are fabricated using the provided error-tolerant alignment, biocompatible process.

15 Claims, 19 Drawing Sheets

U.S. PATENT DOCUMENTS

| | | | |
|---|---|---|---|
| 6,935,772 B2 | 8/2005 | Karp et al. | 366/341 |
| 6,981,522 B2 | 1/2006 | O'Connor et al. | 137/803 |
| 6,993,958 B2 | 2/2006 | Paul | 73/54.05 |
| 7,069,952 B1 * | 7/2006 | McReynolds et al. | 137/833 |
| 7,143,785 B2 * | 12/2006 | Maerkl et al. | 137/597 |
| 7,159,618 B2 * | 1/2007 | Broyer et al. | 137/828 |
| 7,250,128 B2 * | 7/2007 | Unger et al. | 264/155 |
| 2003/0008411 A1 | 1/2003 | Van Dam et al. | 436/174 |
| 2005/0127916 A1 | 6/2005 | Tondra | 324/324 |
| 2006/0197118 A1 * | 9/2006 | Migliorato et al. | 257/253 |

\* cited by examiner

MULTILAYER MICROFLUIDIC DEVICE

CROSS-REFERENCE TO RELATED APPLICATIONS

This application is a continuation in part of U.S. application Ser. No. 11/297,883, filed Dec. 9, 2005, now abandoned which claims priority from U.S. Provisional Patent Application No. 60/635,126, filed Dec. 10, 2004, and which is a continuation in part of U.S. patent application Ser. No. 11/128,105, filed May 11, 2005, which claims priority from U.S. Provisional Patent Application No. 60/570,672, filed May 12, 2004, all of which are incorporated herein by reference.

STATEMENT REGARDING FEDERALLY SPONSORED RESEARCH OR DEVELOPMENT

This invention was made in part with government support under grant no. SPO 26739 awarded by the U.S. Navy. The government has certain rights in this invention.

FIELD OF THE INVENTION

The present invention relates generally to microfluidic devices. More particularly, the present invention relates to microfluidic devices having a rigid substrate layer, a patterned rigid layer, a patterned elastomeric layer, and a rigid support layer.

BACKGROUND

There are currently two main types of microfluidic structures, those that are rigid and those that are elastomeric. Rigid microfluidic structures are constructed from rigid materials such as silicon, quartz, $SiO_2$, or hard polymers. These structures have stable surface chemistry and hydrophilicity, but suffer from several drawbacks. For example, the time and power required for fabrication are relatively high, and planarization and high heat are required for sealing the structures to a substrate.

Elastomeric microfluidic structures are primarily made from poly-dimethylsiloxane (PDMS) and similar elastomers using soft lithography. These structures have superior conformational abilities. However, elastomeric microfluidic structures can buckle or collapse when pressure, vacuum, or topside forces are applied. Elastomeric microfluidic structures will also shear when lateral forces are applied. Thus, ex-situ fabricated elastomeric microfluidic structures cannot be precisely aligned to a substrate using standard alignment tools. In addition, the process of soft lithography has problematic issues pertaining to separating the precision cast elastomeric microfluidic structures from the mold. Accordingly, there is a need in the art to develop microfluidic structures that have the rigidity, superior long-term surface chemistry, hydrophilicity, and alignability of rigid microfluidic structures, with the conformational and low-temperature sealing abilities of elastomeric microfluidic structures.

SUMMARY OF THE INVENTION

The present invention provides microfluidic devices constructed from four layers. The layers include a rigid substrate layer, a patterned rigid layer having thickness t, a patterned elastomeric layer having thickness greater than t, and a rigid support layer. Microfluidic structures in the devices are defined by the alignment of openings in the patterned rigid layer and the patterned elastomeric layer. The openings in the patterned elastomeric layer may have heights that range from between a fraction of the width of the opening to about two times the width of the opening. Preferably, the patterned rigid layer has a thickness of between about 50 nm and about 5 μm. Also preferably, the elastomeric layer has a thickness of between about 1 μm and about 100 μm.

The rigid support layer, rigid substrate layer, and patterned rigid layer may be made of any rigid material, including but not limited to plastic or silicon-containing materials, such as glass, quartz, or $SiO_2$-coated materials. Similarly, the patterned elastomeric layer may be made of any elastomeric material, including but not limited to polydimethylsiloxanes, polymethylmethacrylates, perfluoropolyethers, or combinations thereof. Preferably, the rigid support layer contains a partial cut starting from the top of the rigid support layer and extending from about 10% to about 90% into the rigid support layer.

Microfluidic devices according to the present invention may contain sensors or sensor arrays sealed within the devices and in fluidic connection to the microfluidic structures. In a preferred embodiment, the microfluidic devices contain a plurality of sensors that are split into two or more segments, with the segments connected in series, in parallel, or in any combination thereof. Also preferably, one or more biomolecular or chemical probes are immobilized to each of the plurality of sensors. In a particularly preferred embodiment, sensor segments containing one biomolecular or chemical probe are interspersed spatially with segments containing another biomolecular or chemical probe.

The present invention also provides methods of fabricating multilayer microfluidic devices. With this method, a layer of elastomer is dry etched on a rigid support layer to create at least one opening in the elastomeric layer. Next, a rigid layer is photolithographically patterned on a rigid substrate layer to create at least one opening in the rigid layer. The openings in the dry-etched elastomeric layer and the photolithographically patterned rigid layer are then aligned to define microfluidic structures. The microfluidic structures are then formed by binding the dry-etched elastomeric layer to the photolithographically patterned rigid layer, preferably by spontaneous adhesion at room temperature. Preferably, the photolithographically patterned rigid layer and the dry-etched elastomeric layer are designed to allow relative shifts of at least about two microns in each in-plane direction during alignment while maintaining the functionality of the microfluidic structures. This error tolerant alignment process overcomes the difficulty in interfacing and aligning layers made of two different materials.

BRIEF DESCRIPTION OF THE FIGURES

The present invention together with its objectives and advantages will be understood by reading the following description in conjunction with the drawings, in which.

DETAILED DESCRIPTION OF THE INVENTION

Figure 1:
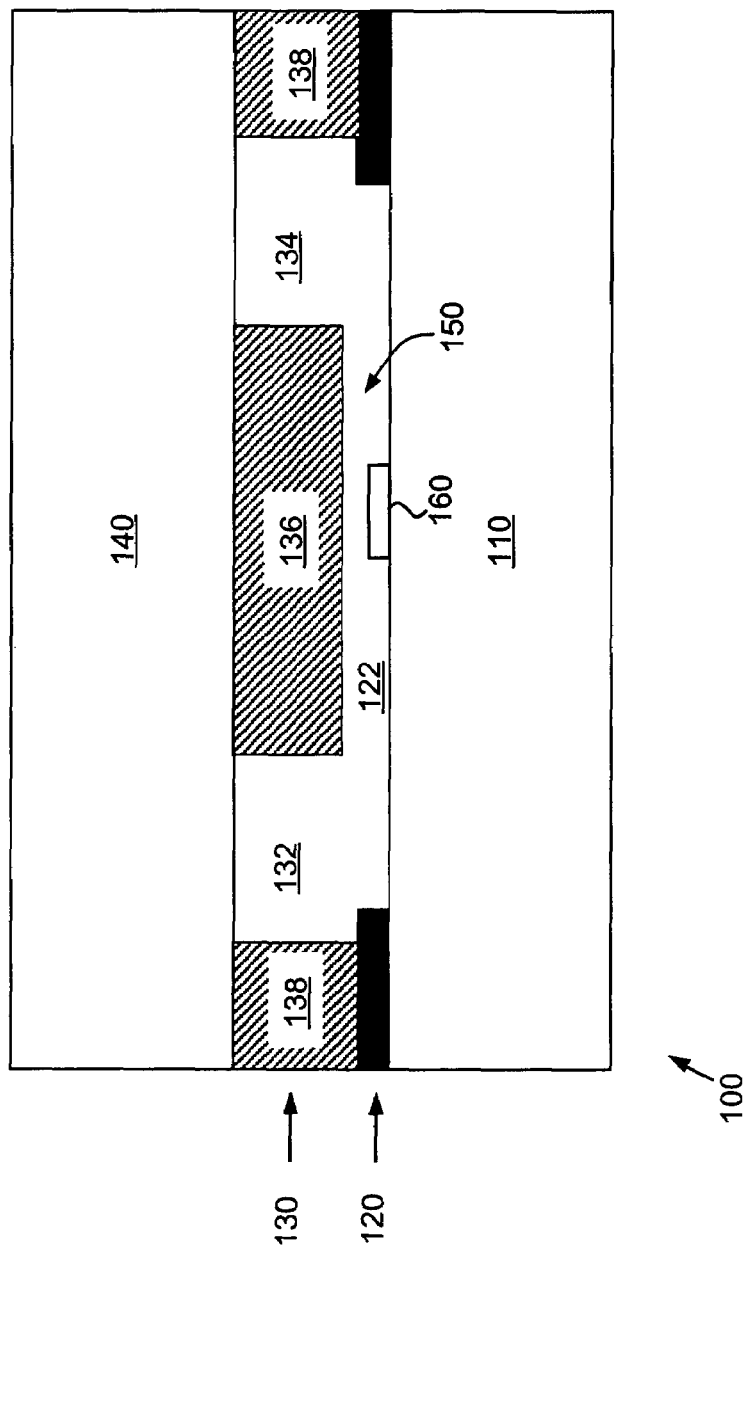
FIG. 1 shows a schematic cross-section of a microfluidic device according to the present invention.

FIG. 1 shows a schematic cross-section of a microfluidic device 100 according to the present invention. Microfluidic device 100 has four layers, including a rigid substrate layer 110, a patterned rigid layer 120, a patterned elastomeric layer 130, and a rigid support layer 140. In addition, the microfluidic device has a sensor 160. The patterned rigid layer 120 has at least one opening 122. Preferably, this opening extends through the entirety of patterned rigid layer 120, as shown in FIG. 1. The patterned elastomeric layer 130 also has at least one opening, such as openings 132 and 134. Preferably, this opening(s) extends through the entirety of patterned elastomeric layer 130, as shown in FIG. 1. Also preferably, the height of the opening(s) in the elastomeric layer can range between being a fraction of the width of the opening(s) and about two times the width of the opening(s). The alignment of openings 122, 132, and 134, define microfluidic structures, such as sensing channel 150.

As shown in FIG. 1, patterned elastomeric layer 130 is preferably thicker than patterned rigid layer 120. Preferably, the thickness of patterned elastomeric layer 130 is in the range of about 1 μm to about 100 μm. The thickness of patterned rigid layer 120 is preferably in the range of about 50 nm to about 5 μm. The thicknesses of patterned elastomeric layer 130 and patterned rigid layer 120 need not be uniform over the entire layer. For example, as shown in FIG. 1, the center segment 136 of patterned elastomeric layer 130 is thinner than outer segments 138 of patterned elastomeric layer 130. Thus, the depths of the openings, the widths of the openings, the thickness of the individual segments of the layers, as well as the positioning of the openings within patterned rigid layer 120 and patterned elastomeric layer 130 define the shape and dimensions of the microfluidic structures in microfluidic device 100.

Rigid substrate layer 110 may be made of any rigid material, including but not limited to quartz, glass, or a $SiO_2$ coated substrate. Patterned rigid layer 120 may also be made of any rigid material, but is preferably a silicon-based material (e.g. quartz, glass, $SiO_2$, etc). Patterned elastomeric layer 130 may be made of any elastomeric material, including but not limited to polydimethylsiloxanes, polymethylmethacrylates, perfluoropolyethers, or combinations thereof. Rigid support layer 140 may be made of any rigid material, including but not limited to glass, silicon, or plastic. While FIG. 1 illustrates a sensor and sensing channel, a sensor need not be present according to the present invention.

Fabrication of a Microfluidic Device According to the Present Invention

Figure 2:
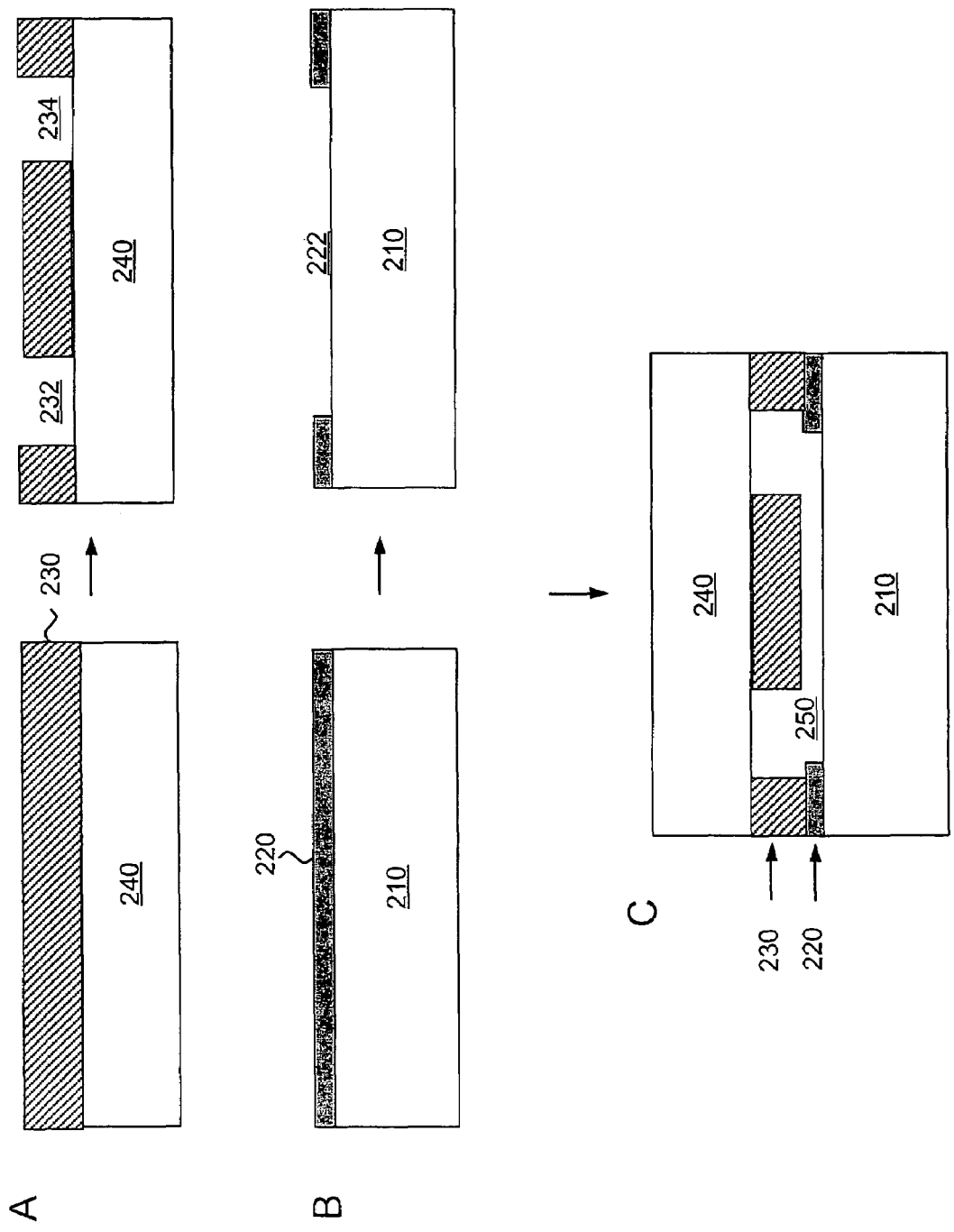
FIG. 2 shows a schematic of a method of fabricating a microfluidic device according to the present invention.

Microfluidic devices according to the present invention may be fabricated as shown schematically in FIG. 2. First, as shown in FIG. 2A, a layer of elastomer 230 is placed on a rigid support layer 240. This layer of elastomer 230 is then patterned, preferably using a dry-etching technique, to form at least one opening, such as openings 232 and 234. Next, as shown in FIG. 2B, a layer of rigid material 220 is placed on a rigid substrate layer 210. The rigid substrate layer 210 and the layer of rigid material 220 may be made of the same or different materials. The layer of rigid material 220 is then patterned, preferably using a photolithography process, to form at least one opening, such as opening 222. Next, as shown in FIG. 2C, the rigid substrate layer 210 with its patterned layer of rigid material 220 is aligned with the rigid support layer 240 and its patterned layer of elastomeric material 230, such that the openings in the patterned layers (such as openings 222, 232, and 234 in FIG. 2) define microfluidic structures, such as channel 250. The patterned layer of rigid material 220 and the patterned layer of elastomeric material 230 are then bonded, preferably via spontaneous adhesion at room temperature.

As mentioned above, the elastomeric layer may be fabricated from any elastomeric material, including but not limited to poly-dimethylsiloxane (PDMS). If using a polymer, the pre-mixed but uncured elastomeric material is diluted with a suitable solvent, such as Xylene, and spun onto the rigid support layer. The elastomeric material is then cured according to the supplier's instructions. The resulting elastomeric layer can be tailored in thickness with the amount of solvent and spinning conditions used.

Subsequently, a thin metal layer is sputtered onto the cured elastomeric layer. This metal layer is then selectively removed by chemical dry etching through a photolithographically patterned resist, such that the channels-to-be are no longer masked by the metal layer. The photoresist used for this purpose can be a standard photoresist, and the dry etching of the metal can be carried out by any method (physical or chemical) that yields good pattern fidelity.

Figure 3:
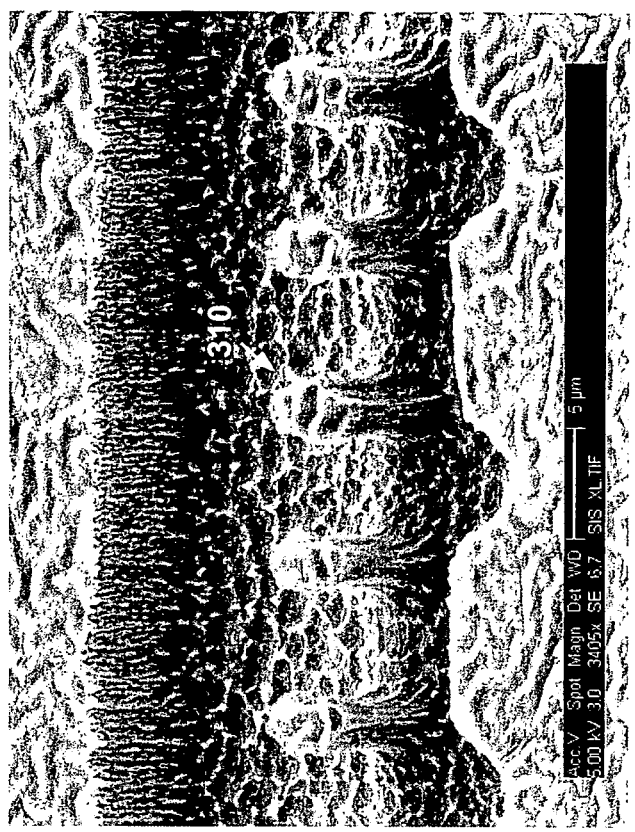
FIG. 3 shows micrographs of a patterned elastomeric layer according to the present invention.
Figure 3:
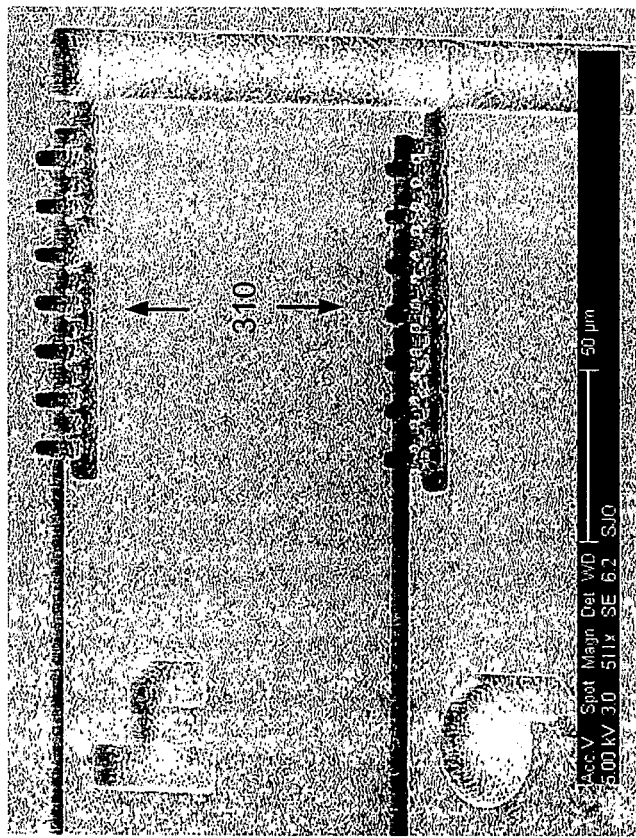

In a preferred embodiment, the metal layer is Aluminum and the elastomeric layer is PDMS. The PDMS is preferably dry etched with a fluorine-based plasma, such as 70% $CHClF_2$ (Freon® 22) and 30% $SF_6$. The PDMS will only be etched where the Aluminum layer exposes it to the fluorine plasma. The etch rate of the fluorine-based chemical etch is fast (several μm/hour in a 200W RF plasma chamber), can be carried out in a standard plasma etcher, and the results are excellent. After etching, the remaining Aluminum is removed with a standard Aluminum wet etch. The resulting etch profiles have excellent anisotropy, leading to sidewall angles of nearly 90° and aspect ratios of up to 2:1 (height:width), as shown in FIG. 3A and FIG. 3B. FIG. 3A shows a partial view of a dry etched elastomeric layer with high resolution and high aspect ratio features 310. FIG. 3B is a detailed view of high resolution and high aspect ratio features 310, which would be very difficult if not impossible to produce with soft imprint lithography.

Figure 4:
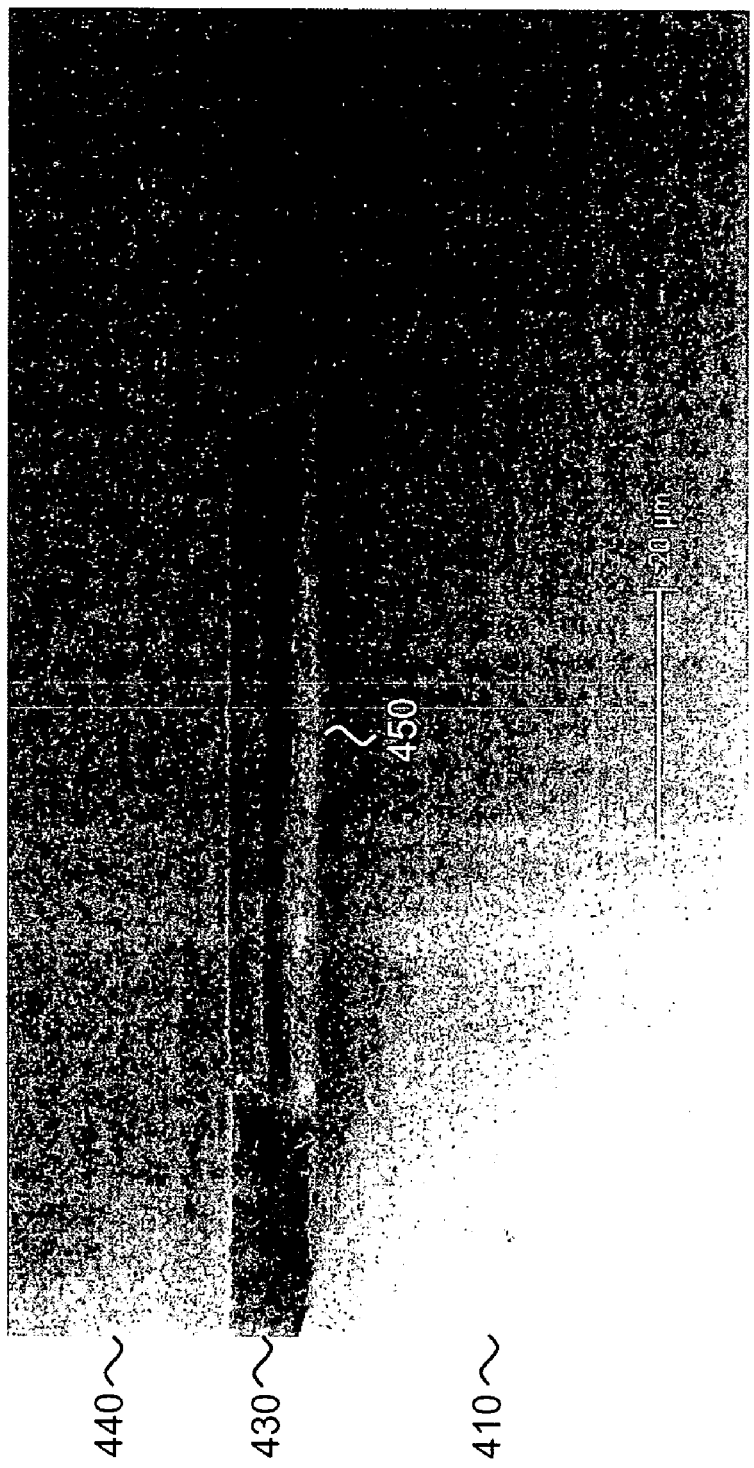
FIG. 4 shows a micrograph of a cross section of a microfluidic device according to the present invention.

If the elastomeric layer is PDMS, it can now be sealed to any quartz, glass, or $SiO_2$-coated patterned rigid layer to form a complete microfluidic channel. A simple microfluidic structure, in which the elastomeric layer is sealed directly to the rigid substrate layer, is shown in FIG. 4 by way of example. FIG. 4 shows rigid substrate layer 410, patterned elastomeric layer 430, rigid support layer 440, and microfluidic channel 450. Since PDMS can be easily and reliably sealed to silicon-based materials at room temperature by simply applying pressure, solvent-based adhesives or high temperature are not needed. Hence, biological molecules and delicate sensors that may be incorporated into the microfluidic device will not suffer damage during the sealing process. The $SiO_2$-PDMS bond can be made even more permanent by activating the PDMS with an oxygen plasma prior to sealing. Thanks to the ability of the PDMS layer to accommodate a small amount of strain in the vertical direction (i.e. perpendicular to the layer plane), sealing to a patterned rigid layer is reliably achieved, even when the mating surfaces of the patterned rigid layer and the PDMS layer are not entirely smooth or coplanar. Similarly, a small piece of contamination, which would prevent a patterned rigid Quartz- or $SiO_2$-based microfluidic layer from making good contact with a second rigid layer, will easily be enveloped and accommodated by the elastomeric layer.

In a preferred embodiment of the invention, the elastomeric layer is etched all the way through, until the support layer is reached, as is schematically shown in FIG. 1 and FIG. 2, and in a real example in FIG. 4. This leads to several important improvements over existing microfluidic structures. First, the roof and floor of the microfluidic structures are made of rigid materials, and as a result the microfluidic structures will not significantly change their cross section under pressure, vacuum, or externally applied forces. Second, since only the sidewalls of the microfluidic structures are made of elastomer, the amount of structure surface made of elastomer is typically less than 20%. As a result, the typical surface chemistry problems of elastomer-based microfluidics, such as hydrophobicity and loss of biocompatibility, can be minimized. Also note that traditional elastomer-based microfluidics are patterned by soft imprint lithography, i.e. curing of the elastomer on a master (mold). This leads to difficulties of separating the cured elastomer cast from the master. High aspect ratio features can often therefore not be fabricated by soft lithography. This separation problem is completely avoided in the provided process since dry etching is used in place of soft lithography to pattern the elastomeric layer. Another advantage of a thin, rigidly backed, and through-etched elastomer structure is that it will not strain as far in the lateral direction, compared to soft lithography elastomer structures, which are typically backed by a several hundred micrometer thick layer of elastomer. This greatly improves the alignment precision when it comes to aligning the elastomeric layer to the rigid substrate or to the patterned rigid layer.

Fabrication of the patterned rigid layer will now be described. The patterned rigid layer can be fabricated right on top of the rigid substrate layer, after the rigid substrate layer has been completed in terms of electronics and sensor fabrication. To achieve fabrication of the patterned rigid layer on the largest number of possible substrates, it is formed from $SiO_2$ (glass or Quartz) that is deposited onto the rigid substrate layer by ion beam deposition. Patterning of the $SiO_2$ can be achieved using a lift-off process. In one example, 1 micrometer thick photoresist is first deposited and patterned to cover opening 222 in FIG. 2B. Layer 220 is then deposited on the entire substrate 210, followed by soaking in photoresist solvent, which removes the photoresist along with the portion of layer 220 on top of the photoresist and creates opening 222.

The patterned rigid layer can be used to define those parts of the microfluidic structure that need to be particularly well aligned to the rigid substrate layer. Such a structure with a requirement for precise alignment is the sensing channel 150 shown in FIG. 1, which must be precisely aligned to the sensor 160. The required alignment is achieved photolithographically by aligning the mask that patterns the photoresist for the lift-off process. The thickness of the patterned rigid layer determines the height of the sensing channel and will typically be in the low micron or near sub-micron range to enhance analytic sensitivity of the sensor. In one example, the sensing channel is about 200 nanometers deep. The channels in the rigid patterned layer are also rarely longer than a few micrometers, thus keeping flow impedance to a minimum.

Figure 5:
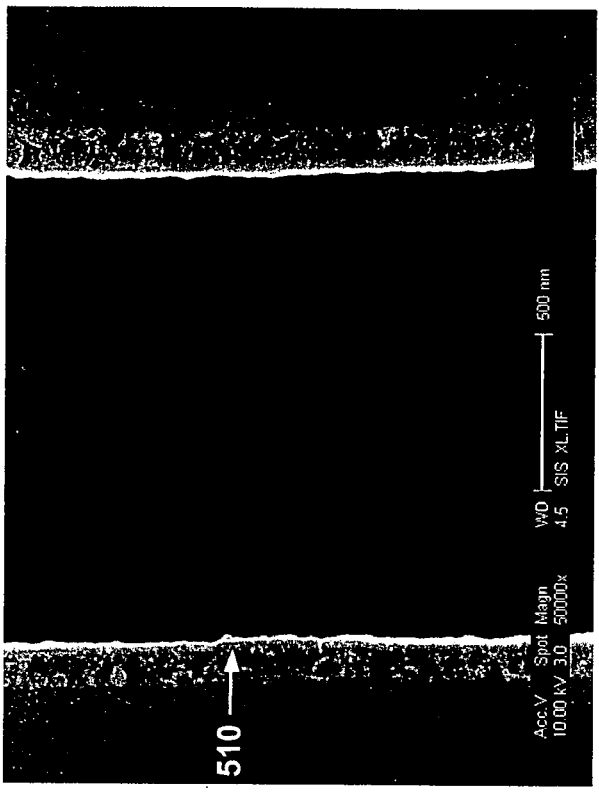
FIG. 5 shows micrographs of a patterned rigid layer according to the present invention.
Figure 5:
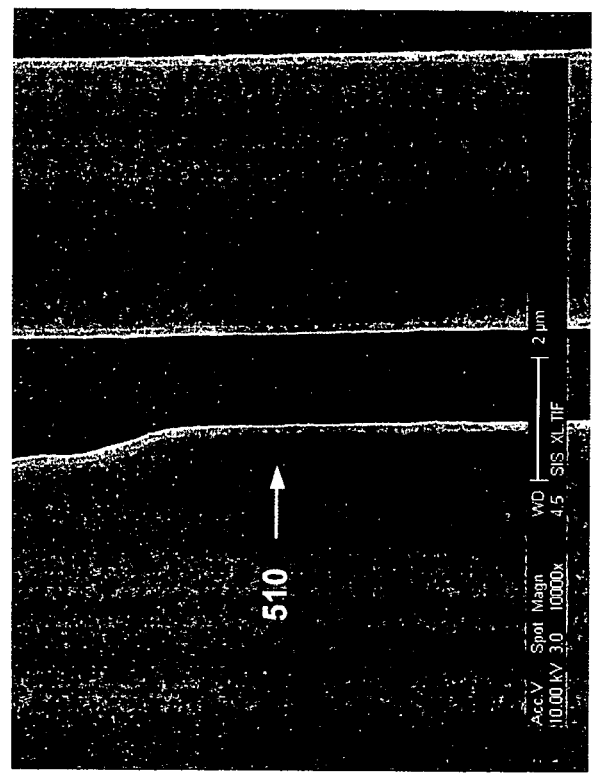

Lift-off processing of the patterned rigid layer provides the advantage that it does not need to expose the rigid substrate layer to any etching steps, and ion beam deposition has the advantage of being a relatively low-temperature and electrically neutral deposition process. All this serves to protect delicate circuitry and sensor technology that may be present on the rigid substrate layer during the fabrication of the patterned rigid layer. The resulting channels in the patterned rigid layer are typically much more shallow than the ones in the patterned elastomeric layer and rarely exceed a few hundred nanometers in depth. However, the channels in the patterned rigid layer can have good edge definition and be very narrow, as shown in FIG. 5A and FIG. 5B. FIG. 5A is a partial view of a patterned rigid layer with channel 510. FIG. 5B is a detailed view of channel 510. Channel 510 has a width of 1.5 µm.

Figure 6:
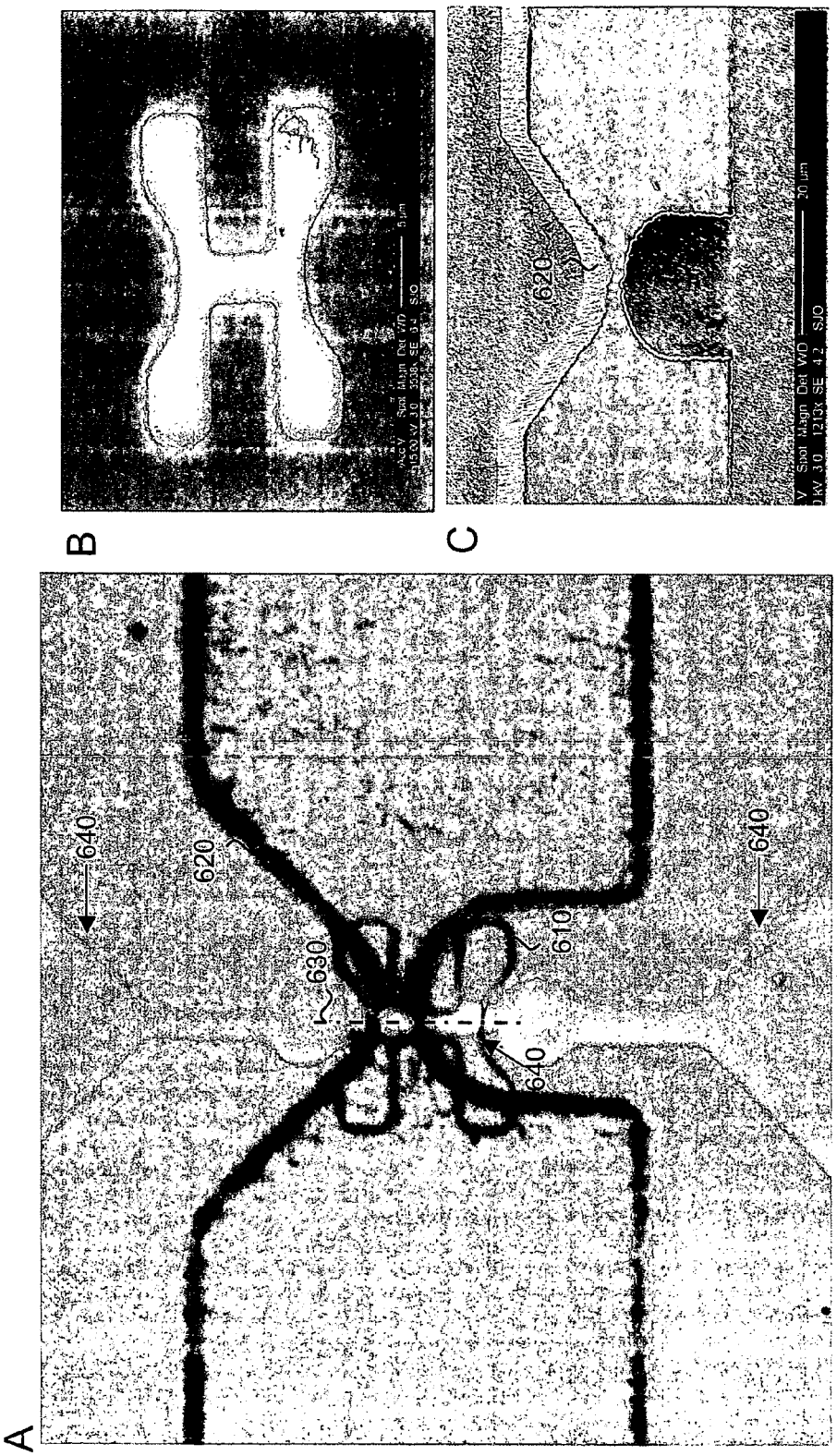
FIG. 6 shows micrographs of a microfluidic device according to the present invention (A), constructed of a patterned rigid layer (B) and a patterned elastomeric layer (C).

Channels in the patterned elastomeric layer and the patterned rigid layer are meant to interface to each other, as schematically shown in FIG. 1 and FIG. 2, and as actually shown in FIG. 6. FIG. 6A shows an optical microscope picture of a patterned rigid layer, with microfluidic feature 610, bonded to a patterned elastomeric layer, with microfluidic feature 620. Electron microscopic pictures of the patterned rigid layer and the patterned elastomeric layer are shown in FIG. 6B and FIG. 6C, respectively. The microfluidic flow direction is roughly vertical along dashed line 630, the cross section of which is similar to that illustrated in FIG. 1, where layer 120 corresponds to feature 610 and layer 130 corresponds to feature 620. White strip 640 corresponds to the sensor 160 in FIG. 1. The funnel-shaped features 650 emanating from the top and bottom of the image are electrical leads contacting the magnetic sensor. If the overlap of the feature 620 in the patterned elastomeric layer and the feature 610 in the patterned rigid layer is generously designed, a small misalignment between these features will not interrupt the interfacing of the patterned elastomeric layer to the patterned rigid layer. Preferably, the overlap is designed to allow relative shifts of at least about two microns in each in-plane direction during the alignment process, while maintaining the functionality of the microfluidic structures. Thus, the alignment of the features in the patterned rigid layer to the rigid substrate layer can be as precise as the manufacturing capabilities allow, while the alignment of the patterned elastomeric layer to the patterned rigid layer is error-tolerant. This should make the bonding of the rigid support layer and the patterned elastomeric layer to the rigid substrate layer and the patterned rigid layer much more reliable, aiding in the ability to automate the process described in this invention. The fabrication of the patterned rigid layer on the rigid substrate layer not only provides for precisely aligned features with submicron depths, but also ensures that the substrate offers a suitable $SiO_2$ interface for bonding to the patterned elastomeric layer and the support layer.

Features in the patterned rigid layer are not necessarily restricted to submicron depths. If so desired, a parallel channel in the patterned elastomeric layer can be placed right on top of a channel in the patterned rigid layer, thereby yielding a channel that has the depth of both channels combined. The microfluidic device developer thus has the choice of three distinct channel depths, namely channels featuring the depth of the patterned elastomeric layer, the depth of the patterned rigid layer, or the depth of these two layers combined.

Biofunctionalization and Packaging of a Microfluidic Device According to the Present Invention After the patterned elastomeric layer and its microfluidic channels have been completed on the rigid support layer, and after the patterned rigid layer and its respective channels have been completed on the rigid substrate layer, but before the two patterned layers are sealed to each other, a biofunctionalization of the substrate layer and/or support layer can be carried out. For example, a robotic applicator could locally dispense bioactive molecules, e.g. DNA or proteins, onto the sensors on the substrate layer, to make them sensitive to a particular analyte. The robotic applicator could be controlled by specialized software that would allow different biomolecules to be precisely applied to different sensors in a sensor array. Such a robotic biofunctionalization is shown by example in the inset 1920 of FIG. 19. Similarly, an anti-biofouling agent that limits adsorption of biological molecules at the channel walls could be applied to the patterned elastomeric layer. All this can be carried out in a cleanroom environment.

The final step of biofunctionalization would be the sealing of the patterned elastomeric layer to the patterned rigid layer, such that the bioactive molecules are fully enclosed within the microfluidic device and are subsequently protected against contamination. As mentioned earlier, since the sealing of PDMS to $SiO_2$ is known to occur spontaneously and at room temperature, biological molecules will not suffer any heat or chemical damage.

After the two patterned layers have been sealed to each other, the set of four layers may be diced into individual microfluidic devices. If the microfluidic structure is created in such a way that it does not cross any layer dicing streets, then it should remain sealed throughout and after the layer dicing process, so that no special precautions need to be taken.

Figure 7:
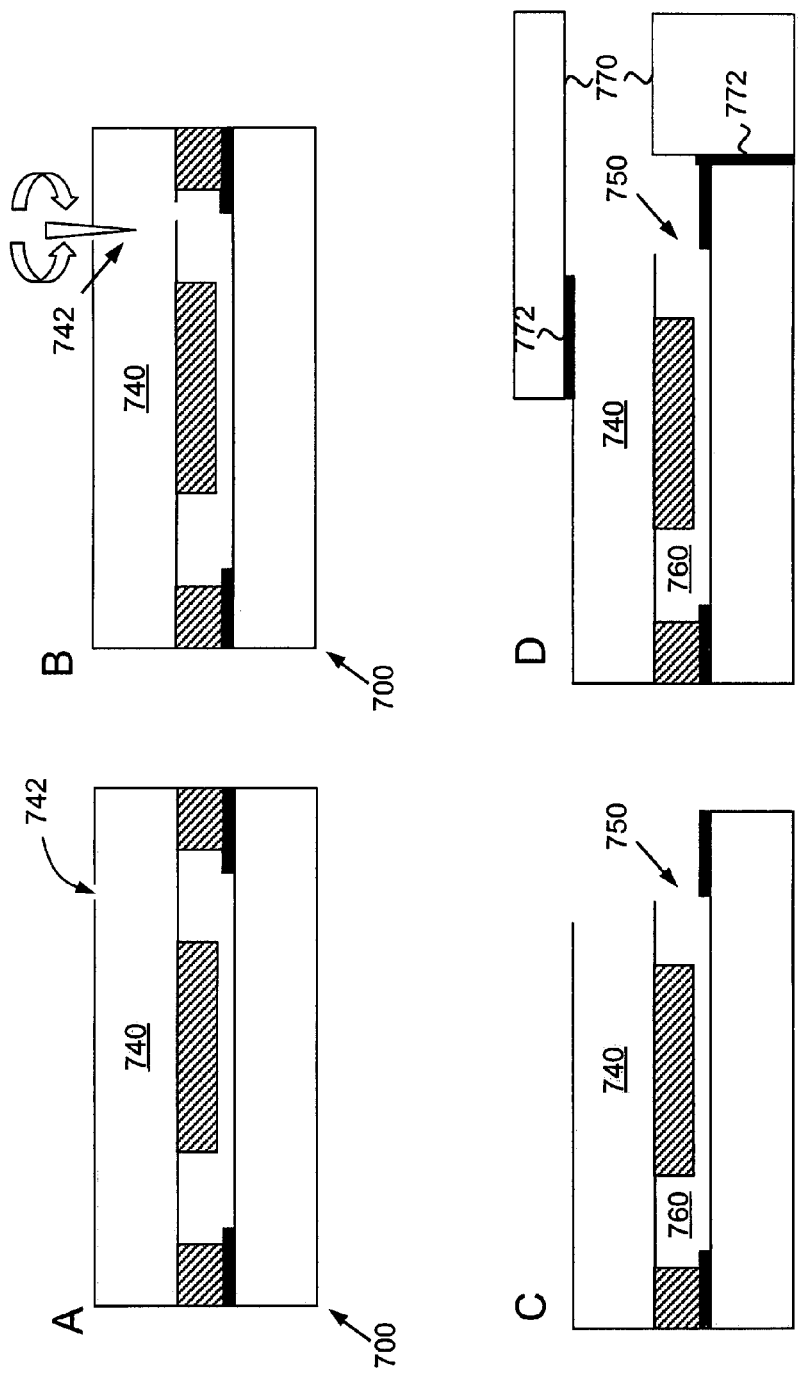
FIG. 7 shows a schematic of a method of accessing a microfluidic device according to the present invention.

This raises the question of how the microfluidic structure can be accessed at the time of use, if it has no openings at the time of layer dicing. The solution is shown schematically in FIG. 7. In short, a partial cut 742 (not traversing the full depth of the support layer) is made into support layer 740, such that part of the support layer, typically an edge, can be easily cleaved off to create an opening to the previously sealed microfluidic device 700 (FIG. 7A). This partial cut can be conveniently made at the time of layer dicing and preferably extends between about 10% and about 90% into support layer 740. After the microfluidic device 700 has been outfitted with partial cut 742 it is suitable for long-term storage, since the sealed state reliably keeps out environmental influences and contamination. At the same time, the microfluidic device is ready for rapid deployment, since the unsealing process can be done in seconds.

When the microfluidic device nears the time of its application, it is thoroughly cleaned on the outside, and an edge of the support layer 740 is cleaved off by forcing the partial cut 742 apart, as shown schematically in FIG. 7B. This creates an opening 750 to the microfluidic structure 760 (FIG. 7C). The now opened chip is easily attached (mounted) to a standardized and mass-produced fluidic holder 770 with a sealing adhesive 772, as shown schematically in FIG. 7D. The fluidic holder then provides a standardized connector to the end user, such as a Luer-Lock (syringe type). Preferably, the fluidic holder contains macrofluidic transporting structures. These structures may be precisely aligned to the opening in the microfluidic device and mounted using, for example, a metered amount of adhesive. Both the opening and mounting steps are preferably performed in a cleanroom environment. Additionally, the mounting step is preferably performed as soon as possible after the opening step to reduce the chance of contamination.

This system yields several advantages, namely that neither the substrate layer nor the support layer needs any pre-drilled holes. Instead, the microfluidic structures are connected over cleaved-off edges that can be rapidly and easily opened when needed. The lack of holes means that there is little risk of contamination from dicing or drilling debris. The lack of holes also significantly reduces production time and cost, and means that automated device handling is now possible (most automated systems are not compatible with devices that have holes). This system also makes it possible to use sensor substrates that cannot accommodate any holes, such that the substrate is completely unaffected by the fluidic access method.

Figure 8:
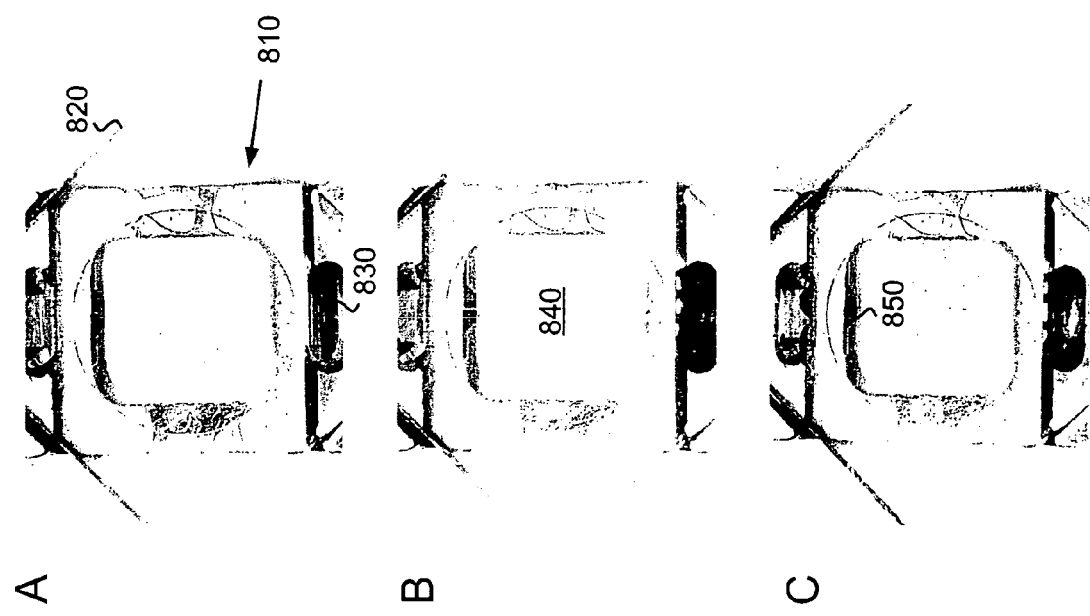
FIG. 8 shows an example of accessing a microfluidic device using the method illustrated in FIG. 7 to produce flow through a microfluidic device according to the present invention.

FIG. 8 shows an implementation of the fluidic interconnect concept outlined in FIG. 7. The microfluidic holder 810 is made from Aluminum and is sealed to microfluidic device 820 with a fast-curing epoxy adhesive. As can be inferred from FIG. 8, and as has been proven during tests, the sealing of the device to the holder with the adhesive is reliable and does not obstruct fluid flow if the sealing procedure is properly designed. FIG. 8 illustrates the successful sealing by showing the advance of a black fluid 830 in the upwards direction through the microfluidic device in three steps. The black fluid in FIG. 8 first appears at the bottom of the device 820 where it interfaces with the microfluidic holder 810 (FIG. 8A). The black fluid then moves across the central microfluidic channel 840 and forms droplets 850 at the top interconnect where it exits the chip and flows back into the Aluminum holder 810 (FIG. 8B and 8C). The fluid transport in this case was pressure-driven and occurred through the fluidic structure shown in detail in FIGS. 9 and 10.

Figure 9:
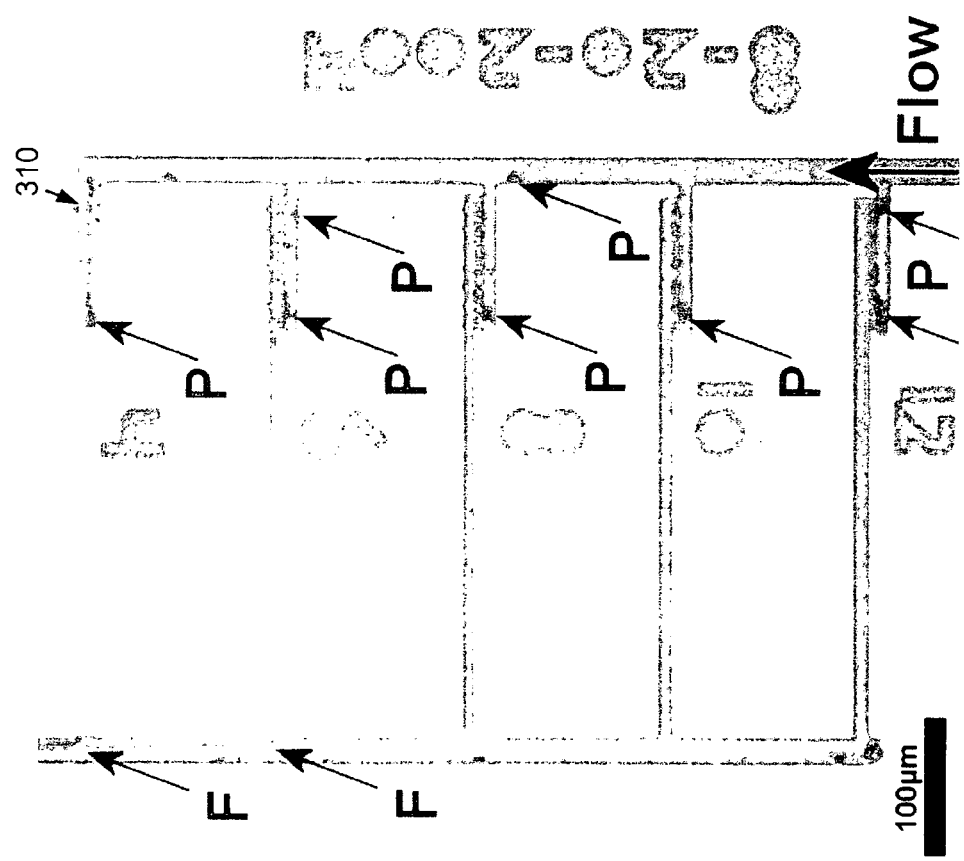
FIG. 9 shows an example of particle filtration using a microfluidic device according to the present invention.
Figure 10:
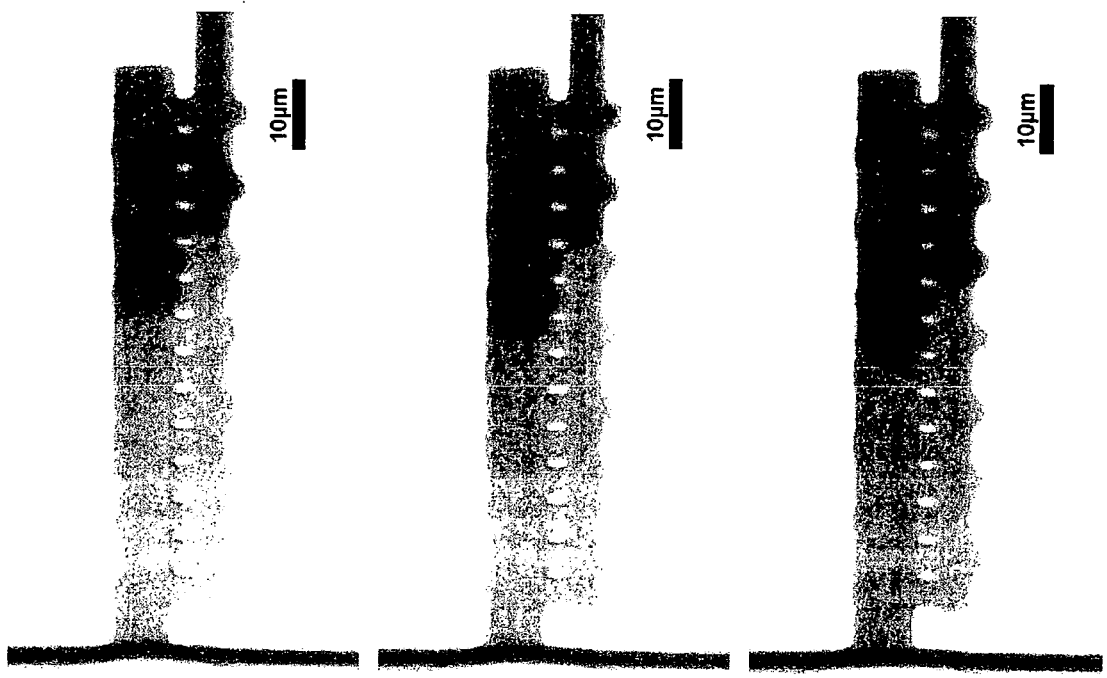
FIG. 10 shows an example of fluid flow through a microfluidic device according to the present invention.

FIG. 9 shows a microfluidic device that features high-aspect ratio pillars 310, which serve as particle filters. These pillars seal well to both the substrate and the support layers, and are shown in detail in FIG. 3. FIG. 9 illustrates flow (as indicated by "Flow") of particles in a solution through the microfluidic device. Particles that have been caught by the filters are indicated by "P". Visible flow lines are indicated by "F". The flow sequence can be seen in more detail in FIG. 10, which is a magnified view of the microfluidic device shown in FIG. 9.

Figure 11:
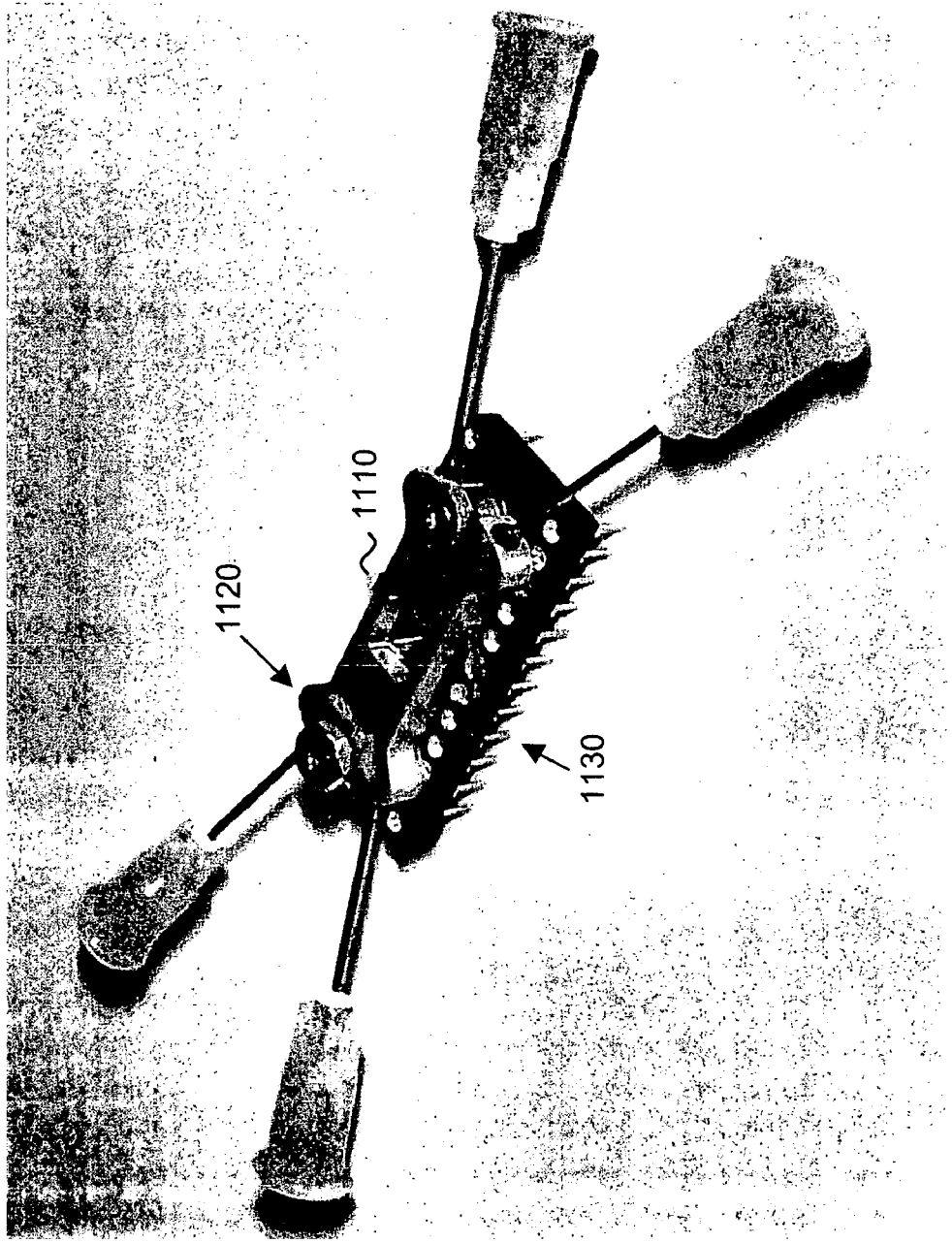
FIG. 11 shows an example of a packaged microfluidic device according to the present invention.
Figure 12:
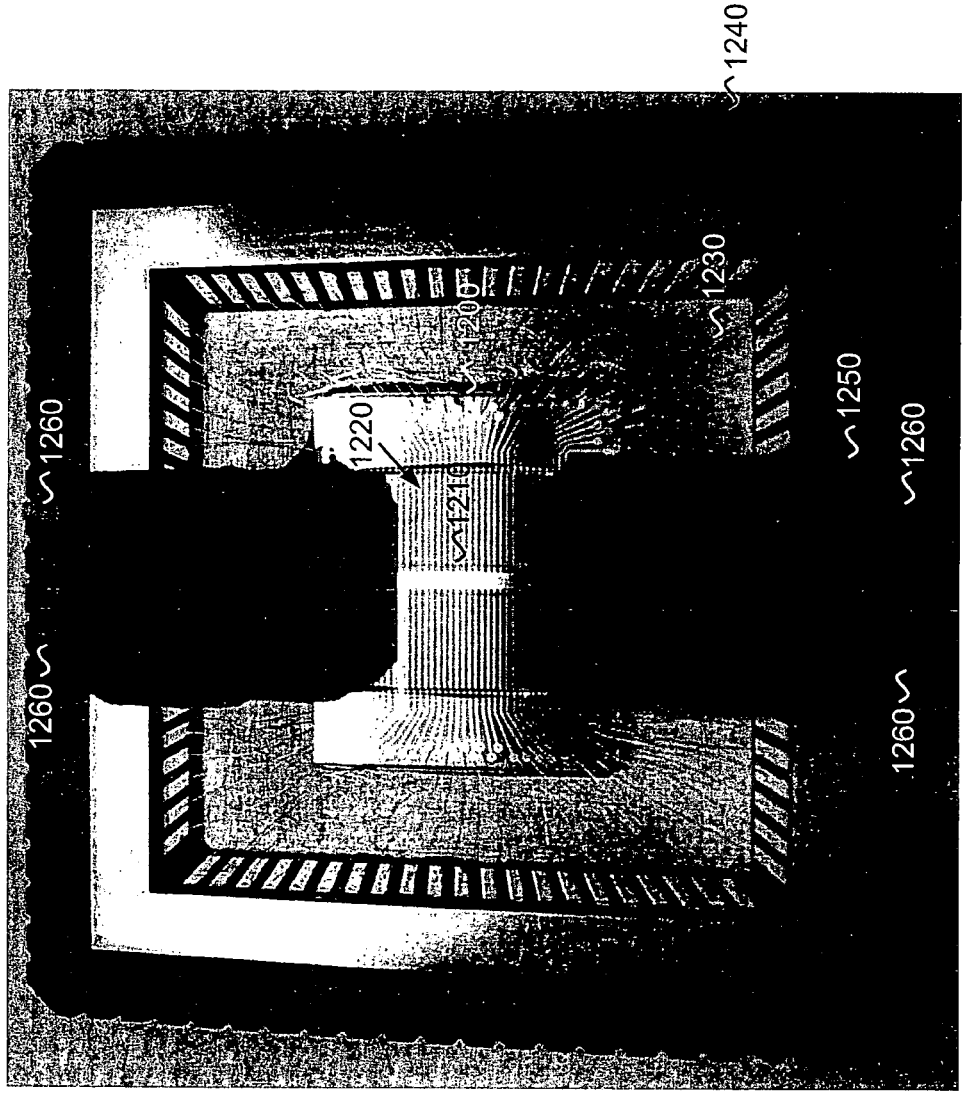
FIG. 12 shows another example of a packaged microfluidic device according to the present invention.

FIG. 11 shows a prototype chip assembly, which shows how a fluidic holder can be accommodated on a standard DIP package. In FIG. 11, microfluidic-electric biochip 1110 is sealed to biochip fluidic holder 1120 and electrical interface 1130. FIG. 12 shows another actual working microfluidic device assembly on an 84 pin LLC package. Microfluidic device 1200 has microfluidic channel and embedded sensor array 1210, and electrical connections, such as leads 1220 and wire 1230, to an 84 pin ceramic LCC package 1240. Microfluidic device 1200 is held by fluidic holder 1250 and has fluidic input/output through polyethylene tubing 1260. Both microfluidic device assemblies demonstrate how both electrical and fluidic connections to the chip are provided in a standardized format, using solely the methods described in this invention.

Figure 13:
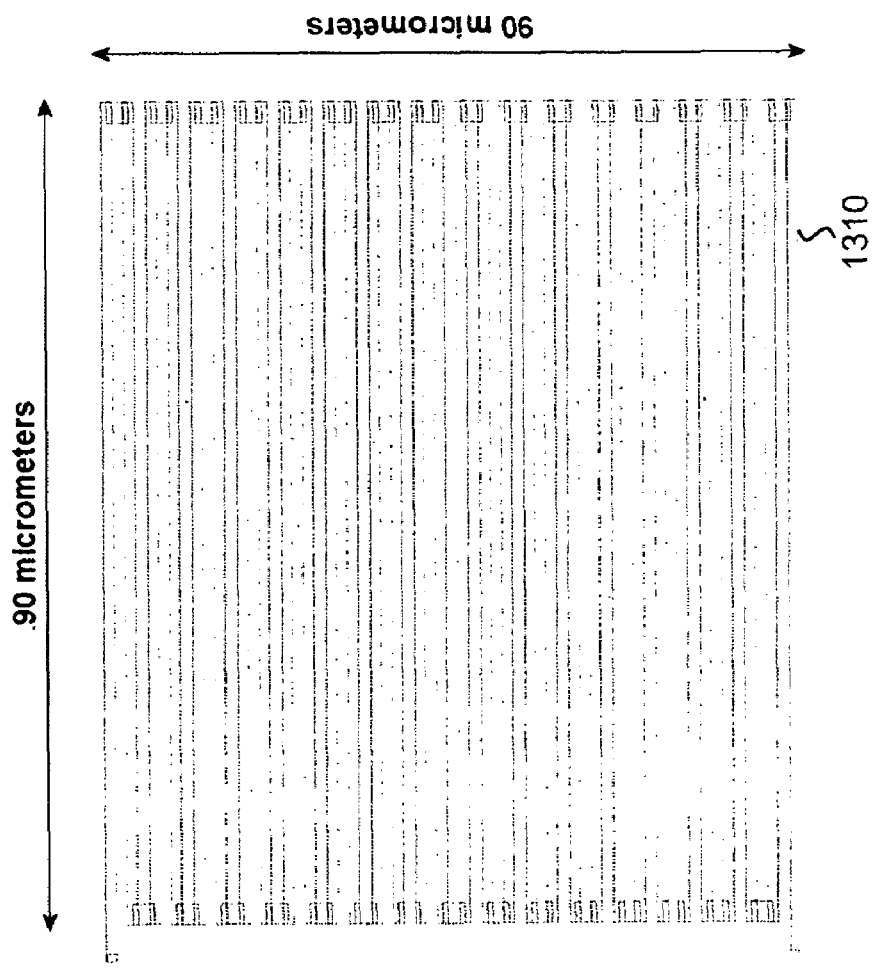
FIG. 13 shows a schematic of a magnetic sensor array according to the present invention.
Figure 14:
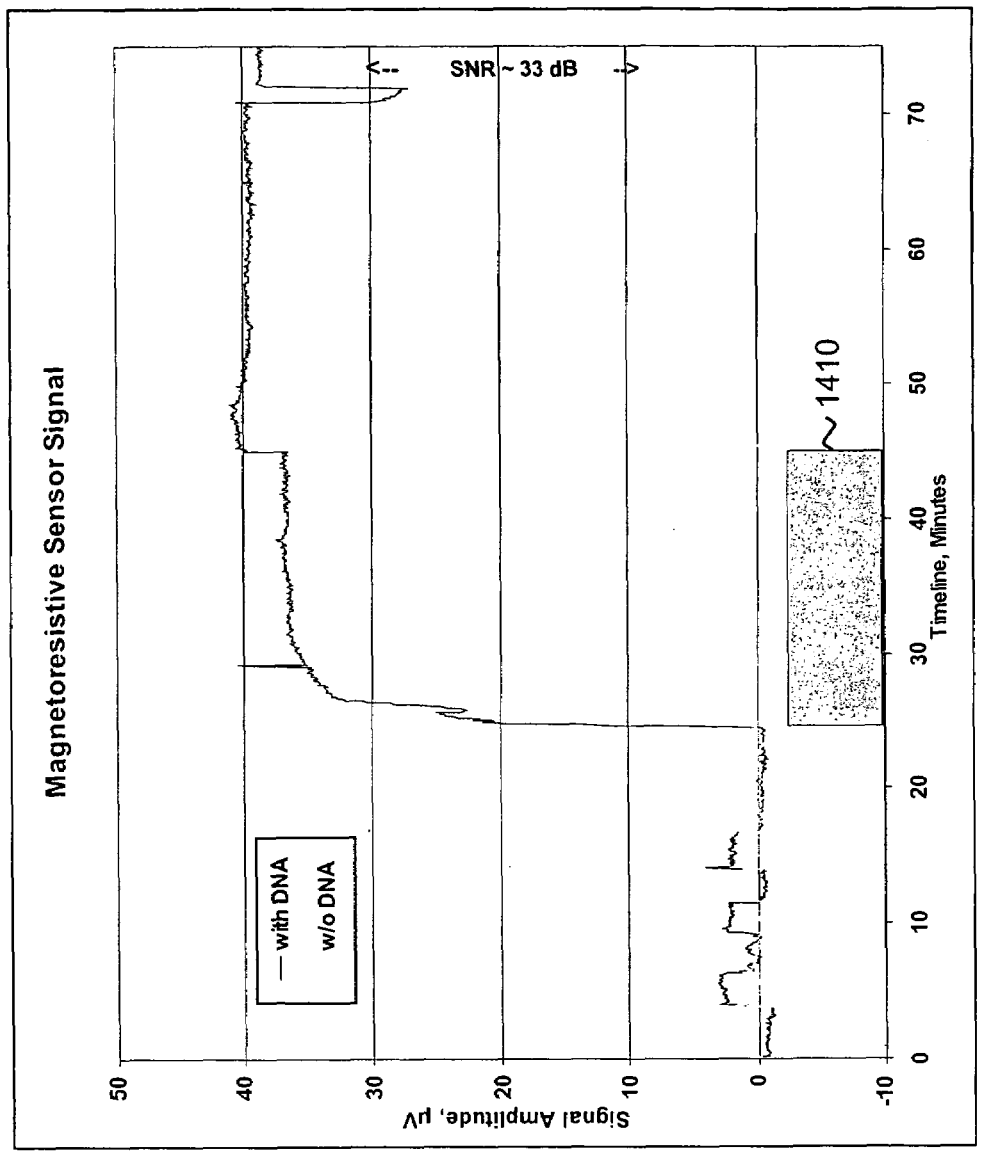
FIG. 14 shows an example of data collected from the magnetic sensor array shown in FIG. 13.

A Magnetic Sensor Array for Use with Microfluidic Devices According to the Present Invention In a preferred embodiment, microfluidic devices according to the present invention include a sensor situated on the substrate layer and in fluidic connection with the microfluidic structures of the device. Preferably, the sensor is a sensor array, such as a magnetic sensor array. The performance of a magnetic sensor array, in terms of overall sensitivity, speed of detection, and ability for parallel, i.e. concurrent detection of multiple signals, is very much affected by the shape and arrangement of the individual sensing elements. The basic design criterion for achieving high performance from magnetic sensors, and magnetoresistive biosensors in particular, is a high effective aspect ratio (length/width) of the sensor of 1000 or greater. A basic example of such a sensor would be a magnetoresistive strip of material, 1 micrometer wide, and 1 millimeter long. In addition, the following variations are possible:

Segmentation and Serial Connection: The sensor may be split into several shorter segments which are arranged as desired and connected in series Segmentation and Parallel Connection: The sensor may be split into several shorter segments which are arranged as desired and connected in parallel Any combination thereof In one example of a sensor array suitable for integration in a microfluidic device according to the present invention, the sensor has a width of about 1.5 micrometers and a total length of approximately 3 millimeters, which yields an aspect ratio of 2000. The sensor is split into 32 segments 1310, which are connected in series, as shown in FIG. 13, thereby reducing the overall measurements of the sensor to about 90×90 micrometers. With the high aspect ratio sensor geometry shown in FIG. 13, DNA detection experiments have been performed in which DNA is labeled with magnetic iron oxide nanoparticles. FIG. 14 shows an example of results from these experiments. Sensors with DNA (gray line) show a distinct signal rise on binding of the nanoparticles, while sensors without DNA (white line) show no signal. (Nanoparticles were introduced during the time period indicated by gray bar 1410). A signal to noise ratio of approximately 33 dB is observed in this experiment. The signal to noise ratio is expected to increase if the sensor shown in FIG. 13 is further miniaturized and modified to incorporate the current state of the art in magnetoresistive thin films.

Figure 15:
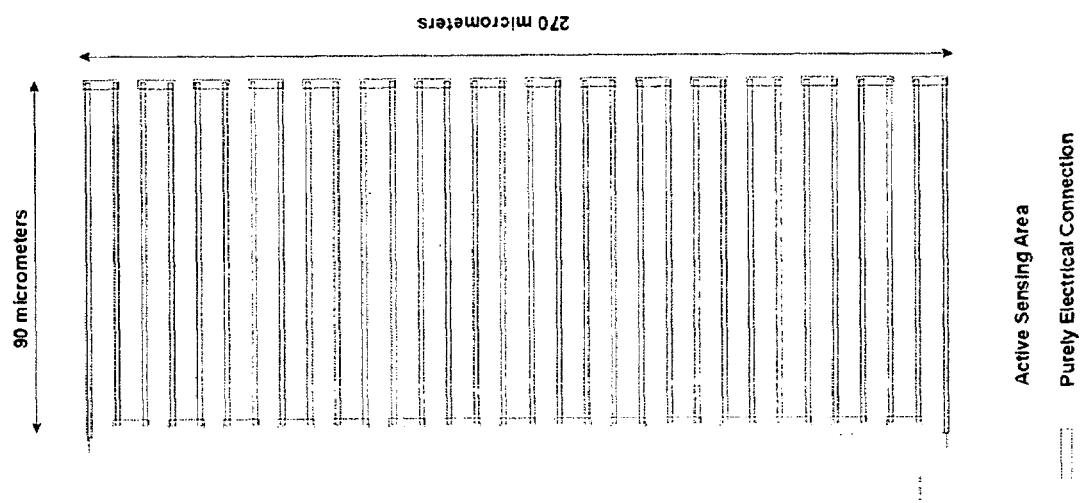
FIG. 15 shows a schematic of an alternative embodiment of a magnetic sensor array according to the present invention.

An important variation of the 32 segment sensor design shown in FIG. 13 is the distribution of the 32 segments over a much larger area, as shown in FIG. 15. Electrical connections are established such that electrically, the sensor is still entirely equivalent to the sensor shown in FIG. 13. However, now that its individual segments are distributed over a larger area, a randomly diffusing detectable entity can encounter the sensor much sooner, since the required diffusion distance and diffusion time are accordingly reduced. As a result, the overall speed of detection is increased, without any degradation of other sensor properties.

Figure 16:
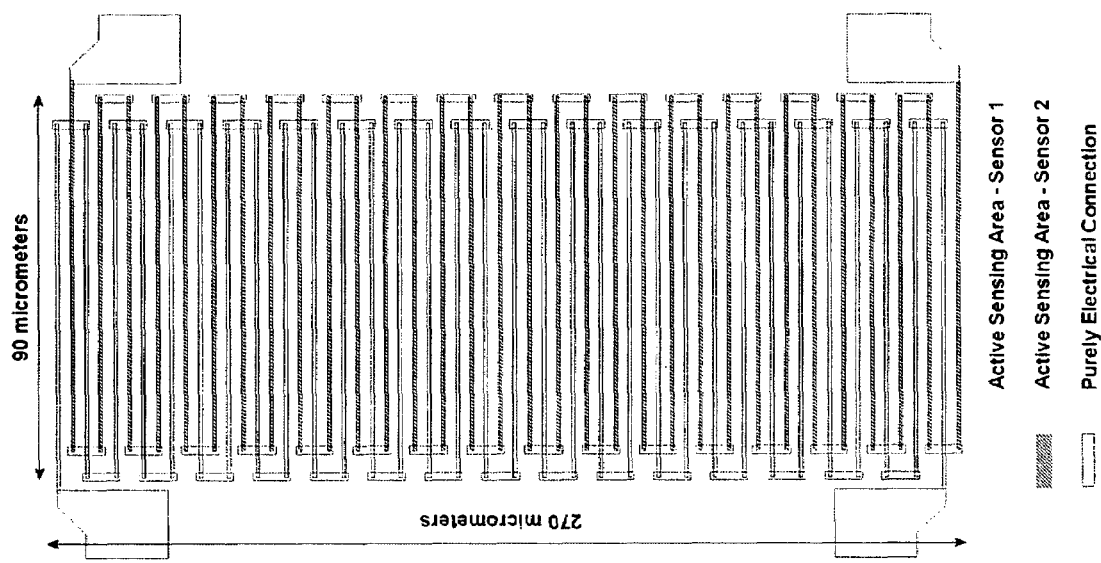
FIG. 16 shows a schematic of an alternative embodiment of a magnetic sensor array according to the present invention.

Note that the resulting empty space between the individual sensor segments in FIG. 15 could be occupied by segments from other sensors. A simple interspersed arrangement of segments from two different sensors is shown in FIG. 16. This interspersed arrangement would result in a beneficial spatial multiplexing of segments from different sensors.

An interspersed and distributed arrangement of sensor segments as shown in FIG. 16 is particularly beneficial when a detectable entity needs to encounter a specifically matching sensor on an array that also contains many non-matching sensors. Instead of having to travel to the particular location of a matching but non-distributed sensor, the detectable entity can be detected as soon as it encounters any of the widely distributed segments of the matching sensor. Due to the distribution of the sensor's segments, it is much more likely that a part of the matching sensor is already nearby. The speed of detection can therefore be dramatically increased.

Note that such a distributed and interspersed arrangement of sensor segments is an optimization scheme that is particularly applicable to direct sensing schemes and sensors with small observation volumes, such as those encountered in the above-described microfluidics structures. For this reason, this optimization scheme is highly suitable for magnetoresistive sensors such as spin valves. A direct sensor with a small observation volume, such as a spin valve, does not require any separate readout mechanism, and hence it can be designed in any shape or distribution without increasing the readout complexity.

Figure 17:
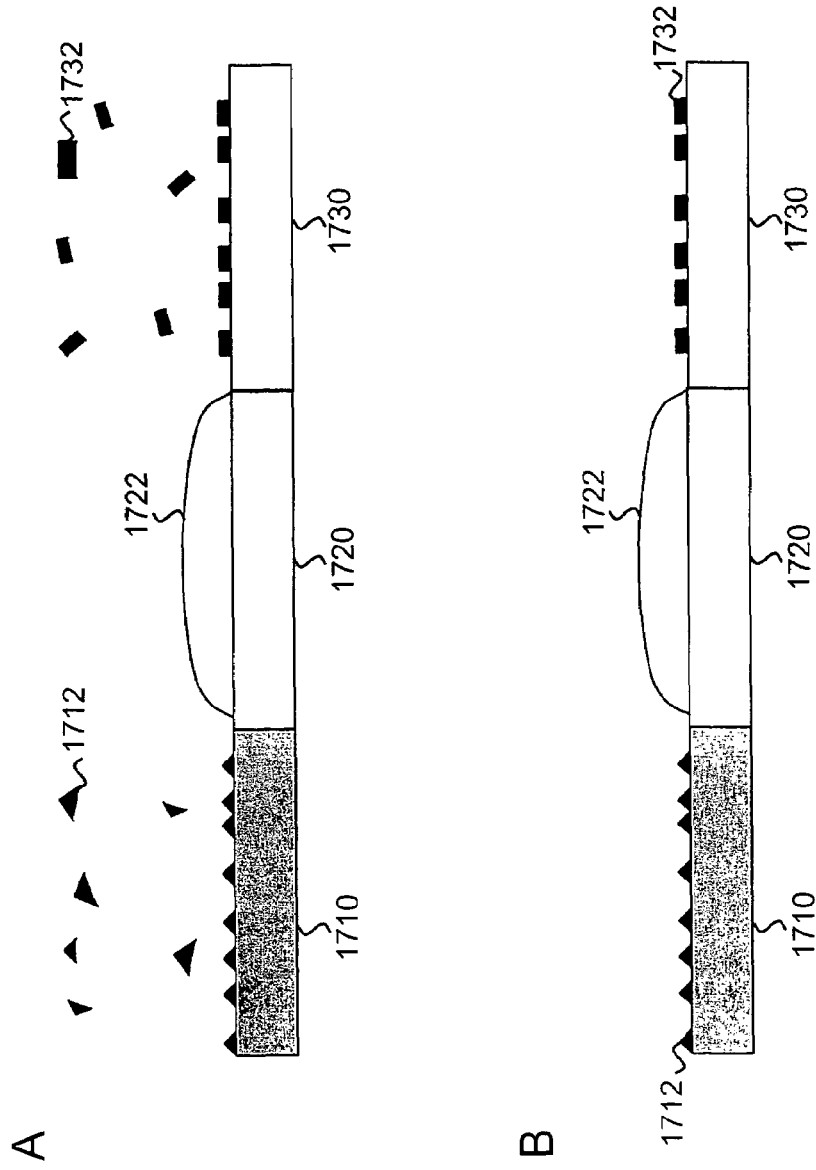
FIG. 17 shows a schematic of a method of biofunctionalizing a magnetic sensor array according to the present invention.
Figure 18:
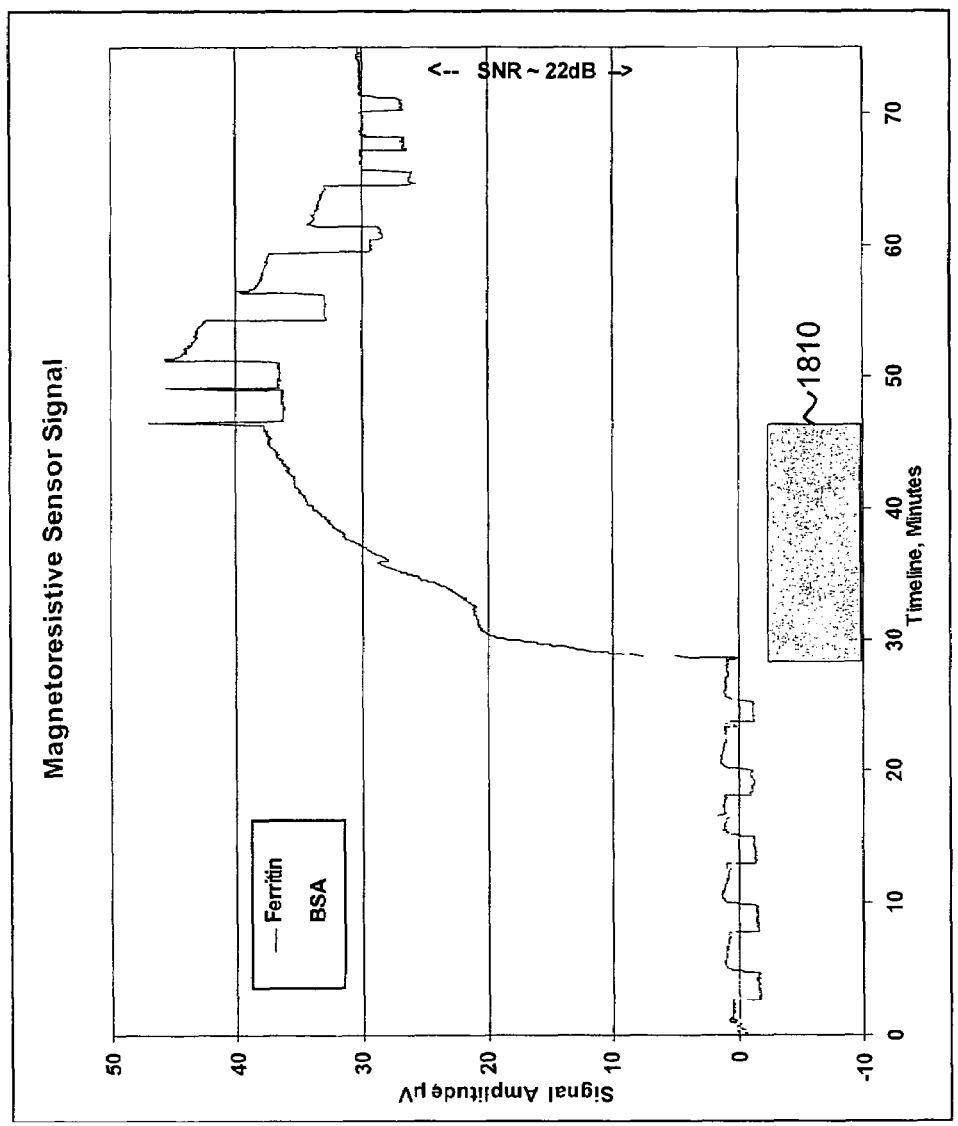
FIG. 18 shows an example of data collected from a biofunctionalized magnetic sensor array according to the present invention.

In a preferred embodiment, one or more biomolecular or chemical probes is immobilized to each sensor segment. More preferably, segments containing one biomolecular or chemical probe are interspersed with segments containing another biomolecular or chemical probe. A schematic of such biofunctionalization is shown in FIG. 17. In FIG. 17A, three sets of sensors are given different treatments. To set 1710, a solution containing a first biomolecule, indicated by triangles 1712, is applied. To set 1730, a solution containing a second biomolecule, indicated by rectangles 1732, is applied. To set 1720, a glue 1722, such as epoxy, is applied such that no biomolecule binds to set 1720. The sensors are then washed to give differentially functionalized sensors (FIG. 17B). An example of an experiment using such sensors is shown in FIG. 18. In this case, the first biomolecule was ferritin, and the second biomolecule was BSA. Once the sensors were biofunctionalized, biotinylated anti-ferritin antibody was applied globally to all the sensors. This resulted in binding of biotinylated anti-ferritin antibody only to the sensors with ferritin. Magnetic nanoparticles with streptavidin were then applied to the sensor array (during the time period indicated by the grey box 1810). In FIG. 18, the signal from sensors biofunctionalized with ferritin is indicated by black line, and the signal from sensors biofunctionalized with BSA is indicated by the white line. FIG. 18 demonstrates that the magnetic nanoparticles bound exclusively to sensors biofunctionalized with ferritin.

Figure 19:
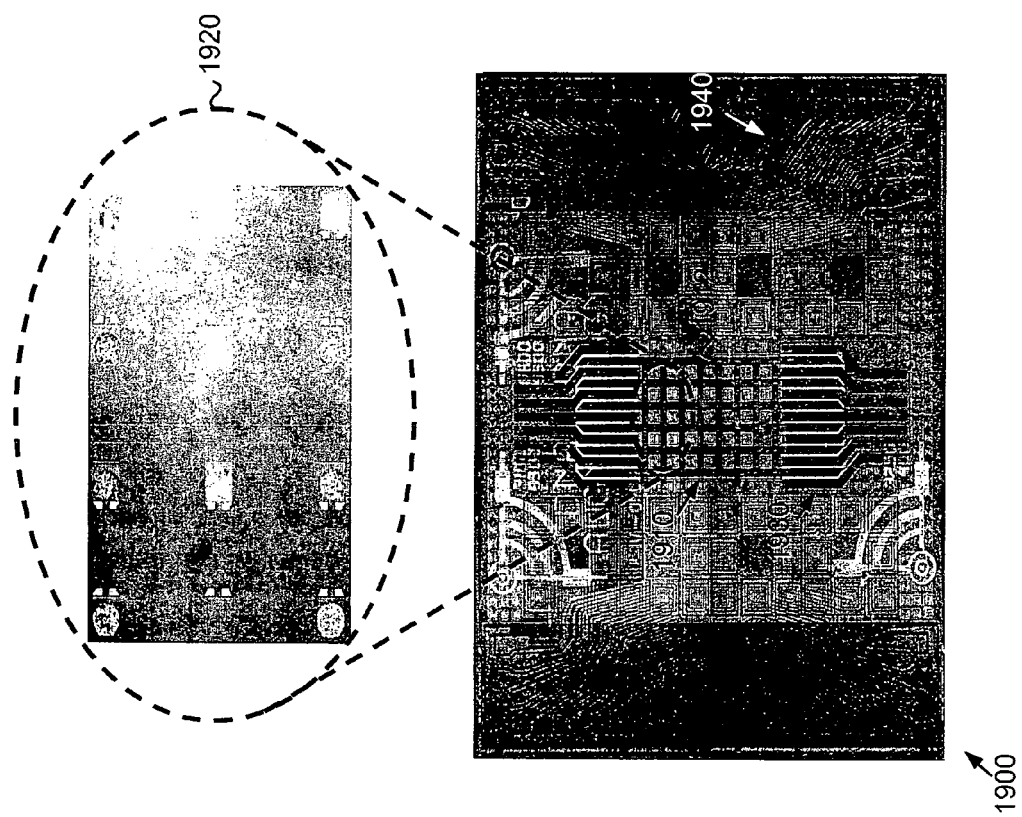
FIG. 19 shows an example of a biofunctionalized magnetic sensor array incorporated into a microfluidic device according to the present invention.

FIG. 19 shows a prototype 8×8 array 1910 of 64 sensors 1912, each of which has 32 spin valve segments that are 1.5 µm wide, 110 µm long and in series connection. Each sensor is covered with a unique biomolecular probe feature, which can be spotted with a robotic pin. A detail of the sensors 1912 is shown in insert 1920. The total area of the microfluidic device 1900 is about 10 mm by 12 mm, while the active 8×8 sensor array 1910 occupies an area of 3×3 mm$^2$. The microfluidic device includes microfluidic sample delivery and washing channels 1930 fabricated with the methods in the present invention, in addition to electrical connections 1940. Submicron width or even narrower spin valves can be used to lower the detection limit of target copy numbers. Furthermore, sensors disclosed in FIGS. 15 and 16 and their variants can be implemented in a manner similar to FIG. 19.

As one of ordinary skill in the art will appreciate, various changes, substitutions, and alterations could be made or otherwise implemented without departing from the principles of

What is claimed is:

1. A microfluidic device, comprising:
   a) a rigid substrate layer, wherein said rigid substrate layer has a first surface and a second surface;
   b) a patterned rigid layer having thickness t, wherein said patterned rigid layer has a first surface and a second surface, wherein said first surface of said patterned rigid layer is bonded to said second surface of said substrate layer, and wherein said patterned rigid layer contains an opening that extends from said first surface to said second surface of said patterned rigid layer;
   c) a patterned elastomeric layer having thickness greater than t, wherein said patterned elastomeric layer has a first surface and a second surface, wherein said first surface of said patterned elastomeric layer is bonded to said second surface of said patterned rigid layer, wherein said patterned elastomeric layer contains at least one opening that extends from said first surface to said second surface of said patterned elastomeric layer, and wherein said at least one opening in said patterned elastomeric layer and said opening in said patterned rigid layer are partially aligned; and
   d) a rigid support layer, wherein said rigid support layer has a first surface and a second surface, and wherein said first surface of said rigid support layer is bonded to said second surface of said patterned elastomeric layer,
   wherein said opening in said patterned rigid layer forms a microfluidic channel, wherein the walls of said microfluidic channel comprises at least three of said layers of said microfluidic device.

2. The microfluidic device as set forth in claim 1, wherein thickness t is between about 50 nm and about 5 µm.

3. The microfluidic device as set forth in claim 1, wherein the thickness of said patterned elastomeric layer is between about 1 µm and about 100 µm.

4. The microfluidic device as set forth in claim 1, wherein said at least one opening in said patterned elastomeric layer has a height that is between a fraction of the width of said opening to about two times the width of said opening.

5. The microfluidic device as set forth in claim 1, wherein said rigid support layer comprises glass, silicon, or plastic.

6. The microfluidic device as set forth in claim 1, wherein said rigid substrate layer comprises quartz, glass, or a $SiO_2$ coated substrate.

7. The microfluidic device as set forth in claim 1, wherein said patterned rigid layer comprises a silicon-based material.

8. The microfluidic device as set forth in claim 1, wherein said patterned elastomeric layer comprises at least one of polydimethylsiloxanes, polymethylmethacrylates, or perfluoropolyethers.

9. The microfluidic device as set forth in claim 1, wherein said rigid support layer has a partial cut starting from said second surface of said rigid support layer and extending from about 10% to about 90% into said rigid support layer, and wherein said partial cut is for unsealing said microfluidic device.

10. The microfluidic device as set forth in claim 1, further comprising a sensor array situated on said rigid substrate layer, wherein said sensor array is fluidically connected to said microfluidic channel, wherein said sensor array comprises a plurality of high aspect ratio sensors, wherein each of said plurality of sensors is split into a plurality of segments, and wherein said plurality of segments are connected in series, in parallel, or in any combination thereof.

11. The microfluidic device as set forth in claim 10, wherein said sensor array is a magnetic sensor array or a magnetoresistive sensor array, and wherein one of said plurality of sensors has a high aspect ratio or an effective aspect ratio greater than about 1000.

12. The microfluidic device as set forth in claim 11, wherein one or more biomolecular or chemical probes is immobilized to each of said plurality of sensors.

13. The microfluidic device as set forth in claim 12, wherein the same or different biomolecular or chemical probes are immobilized to each of said plurality of sensors, and wherein segments containing one of said biomolecular or chemical probes are interspersed spatially with segments containing another of said biomolecular or chemical probes.

14. The microfluidic device as set forth in claim 1, wherein said patterned elastomeric layer is not uniform in thickness.

15. The microfluidic device as set forth in claim 1, wherein said patterned rigid layer is not uniform in thickness.

* * * * *

UNITED STATES PATENT AND TRADEMARK OFFICE
CERTIFICATE OF CORRECTION

| | | |
|---|---|---|
| PATENT NO. | : 7,419,639 B2 | Page 1 of 1 |
| APPLICATION NO. | : 11/388223 | |
| DATED | : September 2, 2008 | |
| INVENTOR(S) | : Osterfeld et al. | |

It is certified that error appears in the above-identified patent and that said Letters Patent is hereby corrected as shown below:

In The Specification Under Column 1:

• Please replace lines 19-21 with:

-- This invention was made with Government support under contract N00014-02-1-0807 awarded by the Department of the Navy ONR. The Government has certain rights in this invention. --

Signed and Sealed this
Nineteenth Day of April, 2011

David J. Kappos
*Director of the United States Patent and Trademark Office*